US006419985B1

(12) United States Patent
Ishizuka

(10) Patent No.: US 6,419,985 B1
(45) Date of Patent: Jul. 16, 2002

(54) METHOD FOR PRODUCING INSULATOR FILM

(75) Inventor: Shuichi Ishizuka, Shiroyama-Machi (JP)

(73) Assignee: Tokyo Electron Ltd., Tokyo-To (JP)

( * ) Notice: Subject to any disclaimer, the term of this patent is extended or adjusted under 35 U.S.C. 154(b) by 0 days.

(21) Appl. No.: 09/578,719

(22) Filed: May 26, 2000

Related U.S. Application Data

(63) Continuation of application No. PCT/JP98/05217, filed on Nov. 19, 1998.

(30) Foreign Application Priority Data

Nov. 27, 1997 (JP) .............................. 9-344000

(51) Int. Cl.$^7$ .............................................. C23C 16/26
(52) U.S. Cl. .................. 427/249.1; 427/577; 427/376.1
(58) Field of Search .............................. 427/577, 249.1, 427/249.6, 96, 99, 376.1

(56) References Cited

U.S. PATENT DOCUMENTS 5,900,290 A * 5/1999 Yang et al. ................. 427/577
6,005,291 A * 12/1999 Koyanagi et al. ........... 257/751
6,071,797 A * 6/2000 Endo et al. ................. 427/577
6,091,081 A * 7/2000 Matsubara et al. ........... 257/52
6,215,087 B1 * 4/2001 Akahori et al. ......... 204/298.12

FOREIGN PATENT DOCUMENTS

| JP | 62-128630 | 8/1987 |
| JP | 63-192867 | 8/1988 |
| JP | 6-333916 | 12/1994 |
| JP | 8-236517 | 9/1996 |

* cited by examiner

Primary Examiner—Bret Chen
(74) Attorney, Agent, or Firm—Finnegan, Henderson, Farabow, Garrett & Dunner LLP

(57) ABSTRACT

A method for producing an insulator film for use as an interlayer dielectric film in a semiconductor device having a multi-level interconnection structure is disclosed. An inert plasma producing gas, such as argon, is introduced into a vacuum vessel along with a thin film deposition gas, such as a compound gas containing fluorine and carbon. Activation of the plasma producing gas activates the thin film producing gas, resulting in a thin fluorine containing carbon insulator film on the semiconductor device. In order to thermally stabilize the insulator layer, the semiconductor device is annealed.

5 Claims, 8 Drawing Sheets

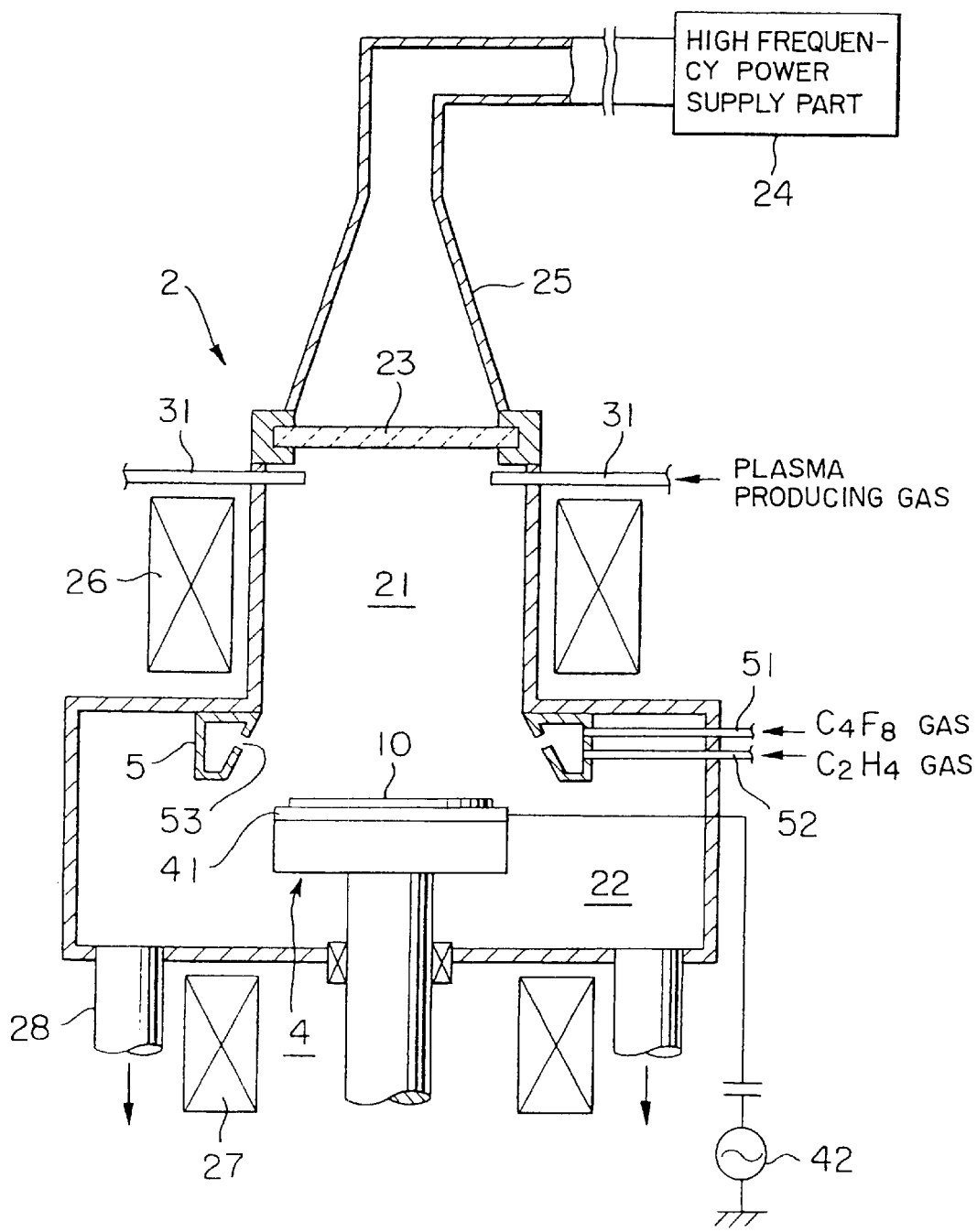
F I G. 1

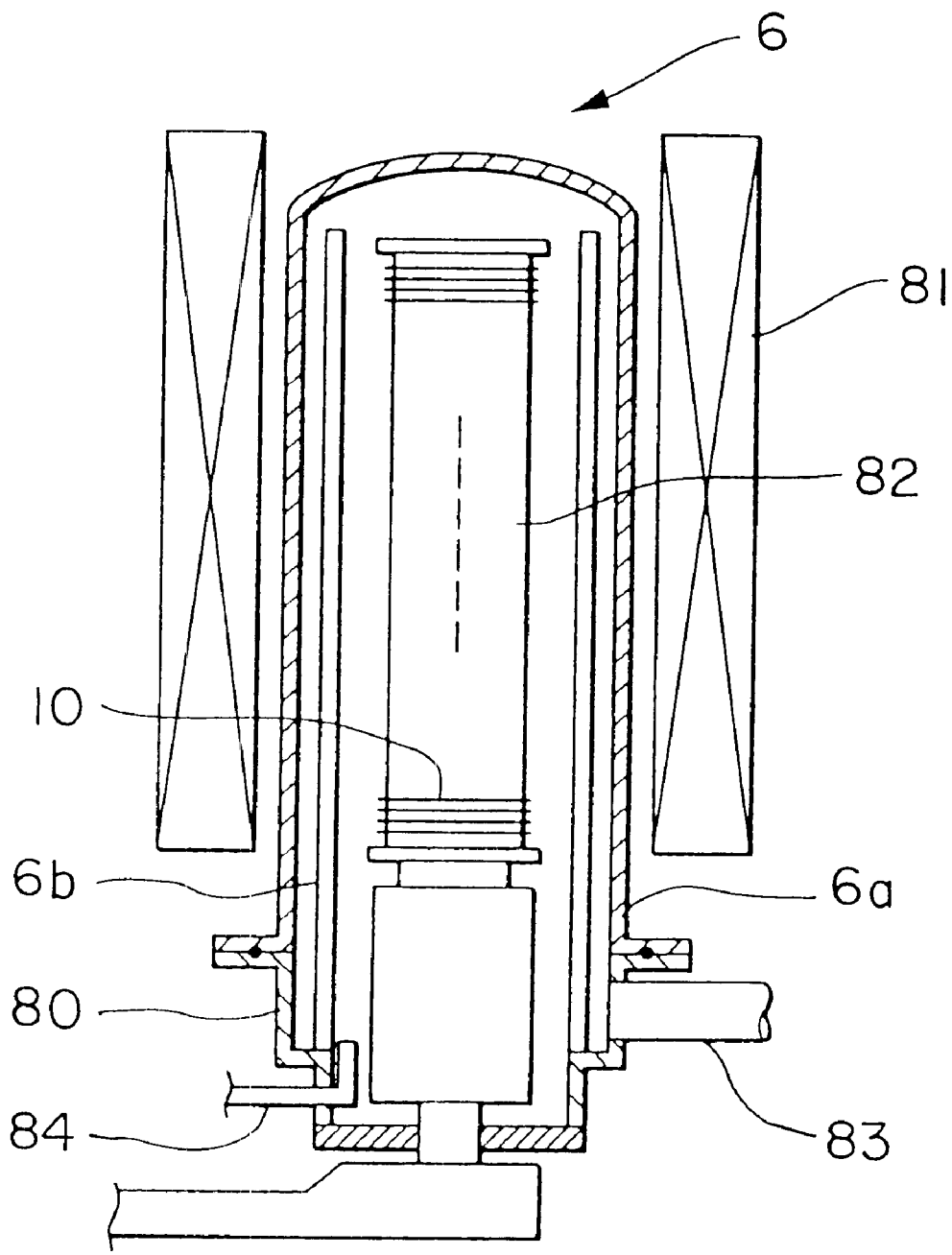
F I G. 2

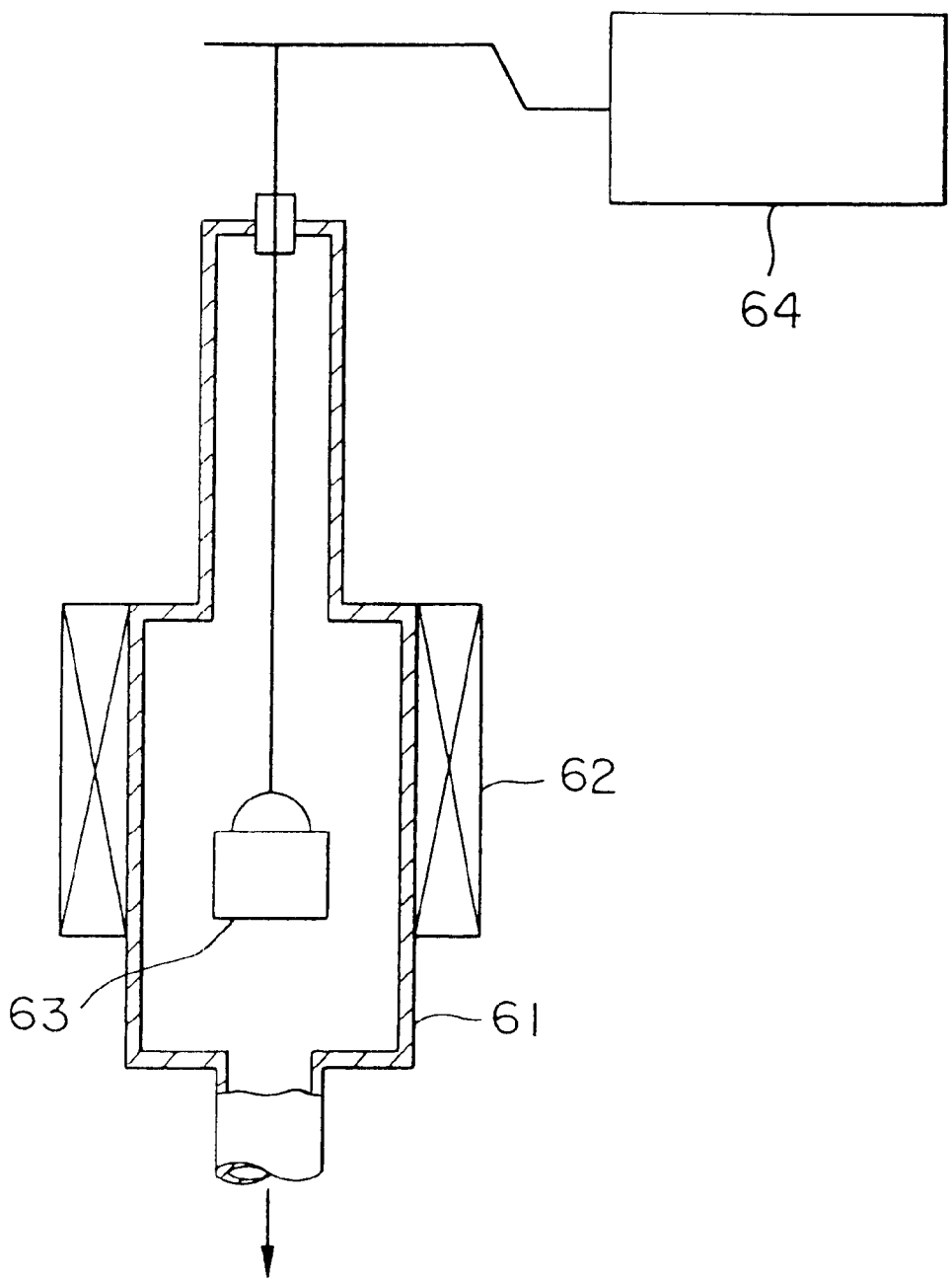
F I G. 4

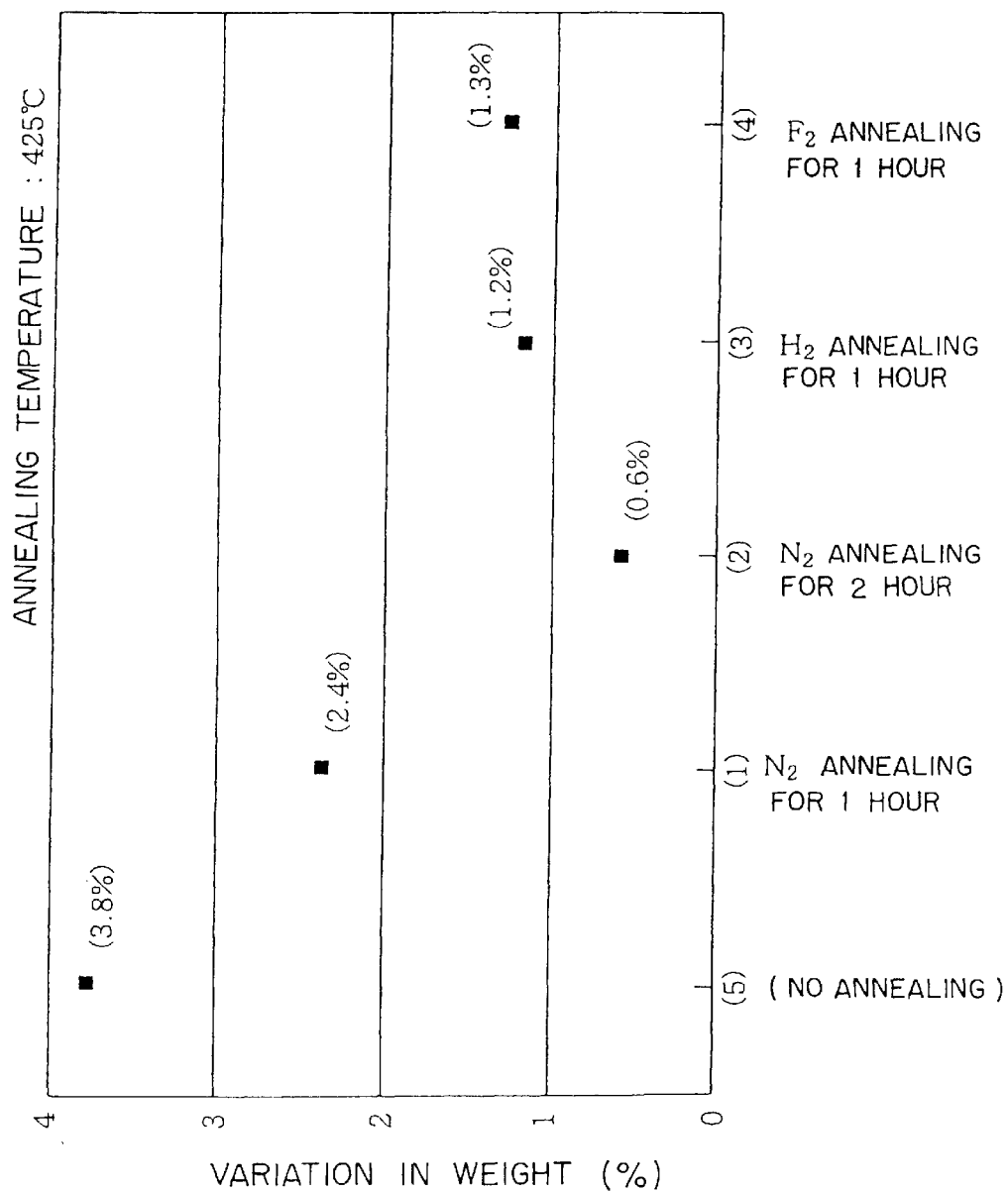
F I G. 5

(BEFORE ANNEALING)
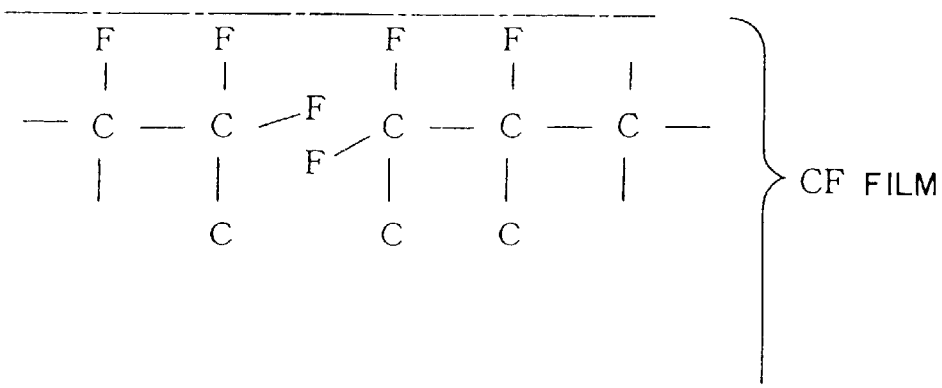
(ANNEALING TREATMENT)
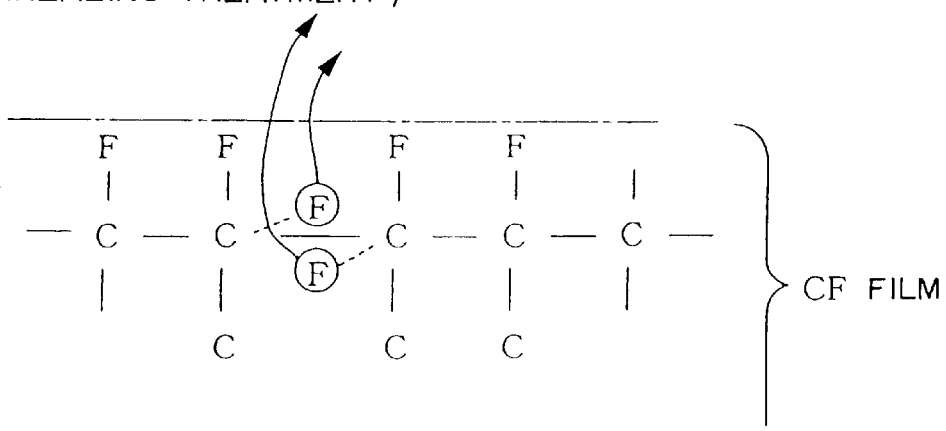
F I G. 6

METHOD FOR PRODUCING INSULATOR FILM

This application is a continuation of International Application No. PCT/JP98/05217, filed Nov. 19, 1998, the content of which is incorporated herein by reference.

TECHNICAL FIELD

The present invention relates to a method for producing an insulator film of a fluorine containing carbon film capable of being used as, e.g., an interlayer dielectric film (an interlayer dielectric film) of a semiconductor device.

BACKGROUND ART

In order to achieve the high integration of a semiconductor device, it has been developed to provide devices, such as the scale down of a pattern and the multilayering of a circuit. As one of such devices, there is a technique for multilayering wirings. In order to provide a multilevel interconnection structure, a number n wiring layer and a number (n+1) wiring layer are connected to each other by means of a conductive layer, and a thin-film called an interlayer dielectric film as an interlayer dielectric film is formed in a region other than the conductive layer.

A typical interlayer dielectric film is an $SiO_2$ film. In recent years, in order to more accelerate the operation of a device, it has been required to reduce the relative dielectric constant of the interlayer dielectric film, and the material of the interlayer dielectric film has been studied. That is, the relative dielectric constant of an $SiO_2$ film is about 4, and it has been diligently studied to dig up materials having a smaller relative dielectric constant than that of the $SiO_2$ film. As one of such materials, it has been studied to put an SiOF film having a relative dielectric constant of 3.5 to practical use. The inventor has taken notice of a fluorine containing carbon film (which will be hereinafter referred to as a "CF film") having a still smaller relative dielectric constant. The CF film is deposited by means of, e.g., the thermal CVD (Chemical Vapor Deposition) or the plasma CVD.

Therefore, the inventor has intended to provide a CF film having high adhesion and hardness using a plasma system for producing a plasma by the electron cyclotron resonance, using gases containing, e.g., a compound gas of carbon (C) and fluorine (F) and a hydrocarbon gas, as thin film deposition gases, on various process conditions.

However, the CF film has the following problems. FIG. 8 shows a part of a circuit part formed on a wafer, wherein reference numbers 11 and 12 denote CF films, 13 and 14 denoting conductive layers of W (tungsten), 15 denoting a conductive layer of Al (aluminum), 16 denoting an $SiO_2$ film, into which P and B have been doped, and 17 denoting an n-type semiconductor region. The W layer 13 is formed at a process temperature of 400 to 450° C. At this time, the CF films 11 and 12 are heated to the process temperature. However, if the CF films are heated to such a high temperature, a part of C—F bonds are cut, so that F gases are mainly desorbed. The F gasses include F, CF, $CF_2$ gases and so forth.

If the F gases are thus desorbed, there are the following problems.

(a) The metal wirings of aluminum, tungsten and so forth are corroded.
(b) Although the insulator film also has the function of pressing the aluminum wiring to prevent the swell of aluminum, the pressing force of the insulator film on the aluminum wiring is decreased by degassing. As a result, the aluminum wiring swells, so that an electrical defect called electromigration is easily caused.
(c) The insulator film cracks, so that the insulation performance between the wirings gets worse. When the extent of the crack increases, it is not possible to form a wiring layer at the next stage.
(d) If the amount of desorbed F increases, the relative dielectric constant increases.

DISCLOSURE OF THE INVENTION

It is therefore an object of the present invention to eliminate the aforementioned problems and to provide a method capable of producing an insulator film of a CF film, which has strong bonds and high thermo stability, e.g., an interlayer dielectric film of a semiconductor device.

According to the present invention, a method for producing an insulator film, comprises: a thin-film deposition step of decomposing a thin-film deposition gas containing a compound gas of carbon and fluorine to deposit an insulator film of a fluorine containing carbon film on a substrate to be treated; and a heat treatment step of heat treating the fluorine containing carbon film to desorb a part of components of the fluorine containing carbon film.

The thin-film deposition step may activate the thin-film deposition gas to form a plasma to deposit the insulator film of the fluorine containing carbon film on the substrate to be treated, with the plasma. The heat treatment step may be a step of annealing the fluorine containing carbon film in an atmosphere of inert gas. Alternatively, the heat treatment step may be a step of annealing the fluorine containing carbon film in an atmosphere of hydrogen gas. Alternatively, the heat treatment step may be a step of annealing the fluorine containing carbon film in an atmosphere of fluorine gas.

According to the present invention, it is possible to provide a CF film which has high thermo stability and a small amount of desorbed F gases. Therefore, if this CF film is used as, e.g., an interlayer dielectric film of a semiconductor device, it is possible to prevent the corrosion of metal wirings, the swell of aluminum wirings and the production of cracks. Since it is required to scale semiconductor devices down and to accelerate the operation of semiconductor devices and since CF films are noticed as effective insulator films having a small relative dielectric constant, the present invention is effective in the practical use of CF films as insulator films.

BRIEF DESCRIPTION OF THE DRAWINGS

FIG. 1 is a longitudinal section of an example of a plasma treatment system for carrying out a method according to the present invention;

FIG. 2 is a longitudinal section of an example of an annealing system for carrying out the preferred embodiment of the present invention;

FIG. 4 is a schematic sectional view of a measuring device for examining the variation in weight of a thin-film;

FIG. 5 is a characteristic diagram showing the relationship between the annealing atmosphere, the annealing time and the variation in weight of a CF film deposited in the preferred embodiment of the present invention;

FIG. 6 is a schematic diagram conceptually showing the state that a C—F bond in a CF film is cut to be recombined;

BEST MODE FOR CARRYING OUT THE INVENTION

Figure 3:
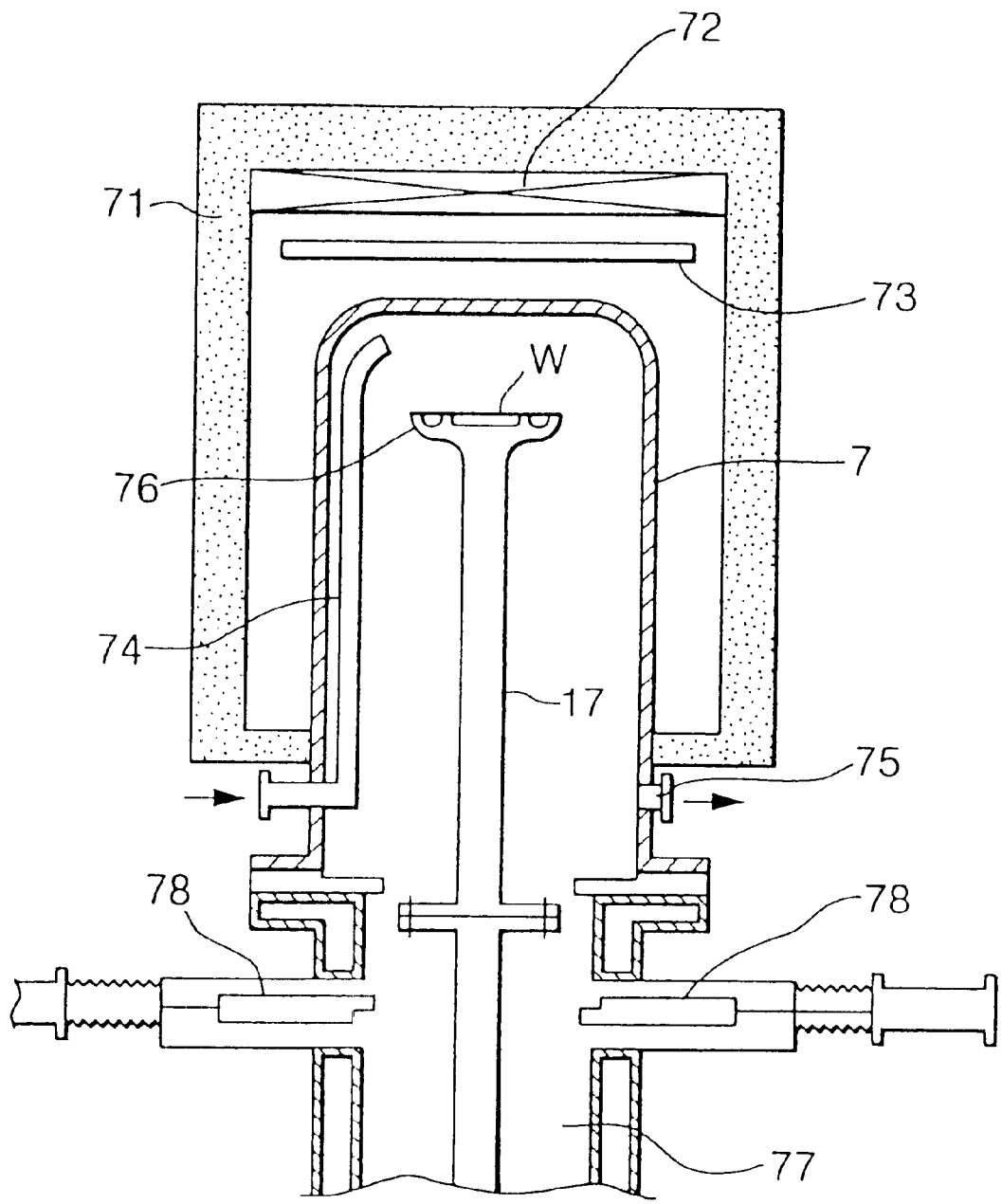
FIG. 3 is a longitudinal section of another example for carrying out the preferred embodiment of the present invention.

FIG. 1 shows an example of a plasma treatment system for use in the preferred embodiment of the present invention. This system has a vacuum vessel 2 of, e.g., aluminum. The vacuum vessel 2 comprises a first cylindrical vacuum chamber 21, which is arranged in an upper portion for producing a plasma, and a second cylindrical vacuum chamber 22, which is communicated with and connected to the lower portion of the first vacuum chamber 21 and which has a greater diameter than that of the first vacuum chamber 21. Furthermore, the vacuum vessel 2 is grounded to have a zero potential.

The upper end of the vacuum vessel 2 is open. A transmission window 23 of a microwave permeable material, e.g., quartz, is airtightly provided in the open upper end of the vacuum vessel 2 so as to hold vacuum in the vacuum vessel 2. Outside of the transmission window 23, there is provided a waveguide 25 connected to a high-frequency power supply part 24 for producing a microwave of, e.g., 2.45 GHz. The microwave produced by the high-frequency power supply part 24 is guided by the waveguide 25 in, e.g., a TE mode, or the microwave guided in the TE mode is converted by the waveguide 25 into a TM mode, to be introduced from the transmission window 23 into the first vacuum chamber 21.

In the side wall defining the first vacuum chamber 21, gas nozzles 31 are arranged at regular intervals along, e.g., the periphery thereof. The gas nozzles 31 are connected to a plasma producing gas source (not shown), e.g., an Ar gas source, and a hydrogen plasma producing gas source (not shown), e.g., an $H_2$ (hydrogen) gas source, so that a plasma producing gas, e.g., Ar gas or $H_2$ gas, can be uniformly supplied to the upper portion in the first vacuum chamber 21.

In the second vacuum chamber 22, a mounting table 4 for a semiconductor wafer (which will be hereinafter referred to as a "wafer") 10 is provided so as to face the first vacuum chamber 21. The mounting table 4 has an electrostatic chuck 41 on the surface thereof. The electrode of the electrostatic chuck 41 is connected to a dc power supply (not shown) for absorbing the wafer and to a high-frequency power supply part 42 for applying a bias voltage for implanting ions into the wafer.

On the other hand, in the upper portion of the second vacuum chamber 22, i.e., in a portion of the second vacuum chamber 22 communicated with the first vacuum chamber 21, a ring-shaped deposition gas supply part 5 is provided. Two kinds of thin-film deposition gases, e.g., a compound gas of C and F, such as $C_4F_8$ gas, and a hydrocarbon gas, such as $C_2H_4$ gas, are supplied from gas supply pipes 51 and 52 to the deposition gas supply part 5, so that the mixed gas thereof is supplied to the vacuum vessel 2 via gas holes 53 formed in the inner peripheral surface of the deposition gas supply part 5.

In the vicinity of the outer periphery of the side wall defining the first vacuum chamber 21, there is arranged a magnetic field forming means, e.g., a ring-shaped main electromagnetic coil 26. Below the second vacuum chamber 22, a ring-shaped auxiliary electromagnetic coil 27 is arranged. To the bottom of the second vacuum chamber 22, exhaust pipes 28 are connected at, e.g., two positions which are symmetrical with respect to the central axis of the vacuum chamber 22.

A method for forming an interlayer dielectric film of a CF film on a wafer 10, which is a substrate to be treated, by means of the system shown in FIG. 1 will be described below.

First, a gate valve (not shown) provided in the side wall of the vacuum vessel 2 is open, and the wafer 10, on which a wiring of, e.g., aluminum, has been formed, is introduced from a load-lock chamber (not shown) by means of a transport arm (not shown) to be mounted on the mounting table 4 to be electrostatically absorbed by means of the electrostatic chuck 41.

Subsequently, after the gate valve is closed to seal the interior of the vacuum vessel 2, the internal atmosphere is exhausted by the exhaust pipes 28, and the interior of the vacuum vessel 2 is evacuated to a predetermined degree of vacuum. Then, a plasma producing gas, e.g., Ar gas, is introduced from the gas nozzles 31 into the first vacuum chamber 21 at a predetermined flow rate, and a thin film deposition gas is introduced from the deposition gas supply part 5 into the second vacuum chamber 22 at a predetermined flow rate.

As the thin-film deposition gas, cyclic $C_4F_8$, gas and a hydrocarbon gas, e.g., $C_2H_4$ gas (ethylene gas), are used. The $C_4F_8$ gas and $C_2H_4$ gas are supplied to the vacuum vessel 2 via the thin-film deposition gas supply part 5 from the gas supply pipes 51 and 52, respectively. Then, the interior of the vacuum vessel 2 is held at a predetermined process pressure, and a bias voltage of 13.56 MHz and 1500 W is applied to the mounting table 4 by means of the high-frequency power supply part 42. In addition, the surface temperature of the mounting table 4 is set to be, e.g., 400° C.

A high-frequency wave (a microwave) of 2.45 GHz from the high-frequency power supply part 24 passes through the waveguide 25 to reach the ceiling of the vacuum vessel 2, and passes through the transmission window 23 to be introduced into the first vacuum chamber 21. On the other hand, in the vacuum vessel 2, a magnetic field extending from the upper portion of the first vacuum chamber 21 to the lower portion of the second vacuum chamber 22 is formed by the electromagnetic coils 26 and 27. The intensity of the magnetic field is, e.g., 875 gausses in the vicinity of the lower portion of the first vacuum chamber 21. The electron cyclotron resonance is produced by the interaction between the magnetic field and the microwave. By this resonance, Ar gas is activated as plasma and enriched. The plasma flowing from the first vacuum chamber 21 into the second vacuum chamber 22 activates $C_4F_8$ gas and $C_2H_4$ gas, which have been supplied thereto, to form active species to deposit a CF film on the wafer W.

Annealing of the CF film obtained by the aforementioned producing method will be described below.

A heat treatment system for annealing for use in the preferred embodiment of the present invention is, e.g., a vertical batch type furnace shown in FIG. 2. This batch type furnace will be briefly described. A reaction tube 6 comprises an outer tube 6a, which is provided above a manifold 80 and which has an upper closed end and a lower open end, and an inner tube 6b, which is provided in the outer tube 6a and which have open ends. The reaction tube 6 is surrounded by a heating furnace 81.

An exhaust pipe 83 is communicated with and connected to the lower portion of the outer tube 6a, and a gas supply pipe 84 is inserted into the lower portion of the inner tube 6b so that an inert gas, such as $N_2$ gas (nitrogen gas), $H_2$ gas or $F_2$ gas is introduced from the lower side of the inner tube 6b.

A method for annealing a CF film, which has been deposited on a wafer W, using the aforementioned annealing system will be described below. First, a plurality of wafers W, on each of which a CF film has been deposited, are held on a wafer boat 82 so as to be arranged at regular intervals, and introduced into the reaction tube 6. Then, while the interior of the reaction tube 6 between the outer tube 6a and the inner tube 6b is evacuated by means of the exhaust pipe 83 to be maintained in a predetermined pressure atmosphere, an inert gas, $H_2$ gas (hydrogen gas) or $F_2$ gas (fluorine gas) is introduced from the lower side of the inner tube 6b at a flow rate of from 50 sccm to 10 slm. Then, annealing is carried out for 10 minutes to 2 hours while the annealing temperature is controlled at, e.g., 200° C. to 500° C. When $N_2$ gas (nitrogen gas), $H_2$ gas and $F_2$ gas are used, the pressures during annealing are set to be in the range of from 0.1 Pa to 1 MPa, from 0.1 Pa to 100 KPa, and from 0.1 Pa to 1 MPa, respectively.

The furnace for use in the wafer annealing technique should not be limited to a vertical batch type furnace, but a single wafer processing heat treating furnace shown in FIG. 3 may be used. This heat treating furnace will be briefly described. Reference number 7 denotes a vertical reaction tube, 71 denoting a heat insulating furnace, 72 denoting a resistance heating element, 73 denoting a soaking element, 74 denoting a gas supply pipe, 75 denoting an exhaust pipe and 76 denoting a wafer holder. A single wafer W is put on the wafer holder 76 in a transfer chamber 77 by means of a transport means (not shown). After the wafer holder 76 is moved upwards to a predetermined position, a shutter 78 is closed. Then, the wafer W is heated to a predetermined heat treatment temperature by means of the resistance heating element 72, and an inert gas, $H_2$gas or $F_2$gas is supplied from the gas supply pipe 74 to the reaction tube 7.

Thereafter, when a device is actually produced, the CF film is etched with a predetermined pattern, and a film of, e.g., W (tungsten) or Al (aluminum), is embedded in a groove portion to form a wiring.

In order to examine the stability of the CF film obtained in the preferred embodiment of the present invention, experiments were carried out. The results thereof will be described below. The thin-film deposition conditions for the CF film using the plasma treatment system shown in FIG. 1 were as follows. The flow rates of $C_4F_8$ gas, $C_2H_4$ gas and Ar gas were set to be 40 sccm, 30 sccm and 150 sccm, respectively. The process temperature was set to be 400° C., and the process pressure was set to be 0.1 Pa. The microwave power was set to be 2700 W. The annealing conditions using the heat treatment system shown in FIG. 2 were the following four conditions. That is:

(1) Annealing was carried out for 1 hour at an annealing temperature of 425° C. in an atmosphere of $N_2$ under a pressure of 101000 Pa (1 atm) at an $N_2$ gas flow rate of 30 SLM;

(2) Annealing was carried out for 2 hours at an annealing temperature of 425° C. in an atmosphere of $N_2$ under a pressure of 101000 Pa (1 atm) at an $N_2$ gas flow rate of 30 SLM;

(3) Annealing was carried out for 1 hour at an annealing temperature of 425° C. in an atmosphere of $H_2$ under a pressure of 532 Pa at an $H_2$ gas flow rate of 600 sccm; and (4) Annealing was carried out for 1 hour at an annealing temperature of 425° C. in an atmosphere of $F_2$ under a pressure of 532 Pa at an $F_2$ gas flow rate of 600 sccm.

As a comparative sample, there was prepared a sample (5) wherein no annealing was carried out after a CF film was deposited.

With respect to the aforementioned samples (1) through (5), the variations in weight at a high temperature serving as an index of the thermo stability of a thin-film were examined by means of a measuring device shown in FIG. 4. As a measuring method, a method for shaving the CF film on the wafer to put the shaven CF film in a crucible 63 to raise the temperature in the crucible 63 to 425° C. under a vacuum atmosphere to heat the CF film for 2 hours to examine the variation in weight in a weight measuring part 64 was adopted. The results thus obtained are shown in FIG. 5. Furthermore, the variation in weight means a value of $\{(A-B)/A\}\times100$ assuming that the weight of the thin-film in the crucible before heating is A and the weight of the thin-film in the crucible after heating is B.

As can be seen from FIG. 5, the variation in weight in the case of (1) $N_2$ annealing for 1 hour was 2.4%, and the variation in weight in the case of (2) $N_2$ annealing for 2 hours was 0.6%. In addition, the variation in weight in the case of (3) $H_2$ annealing for 1 hour was 1.2%, and the variation in weight in the case of (4) $F_2$ annealing for 1 hour was 1.3%. On the other hand, in the case of (5) no annealing, the variation in weight was 3.8%. Therefore, it can be understood that the thermo stability of the CF film is high and the amount of degassing is small if annealing is carried out according to the preferred embodiment of the present invention.

It is considered that the reason for this is as follows. When heat is applied to the CF film by annealing, weak C—F bonds in the CF film are cut to desorb F, CF, $CF_2$, $CF_3$ and so forth, so that uncombined hands remain. Since the CF film is heated, atoms can move to some extent, so that the uncombined hands are recombined with each other as shown in FIG. 6. At this time, since the bonds formed by the recombination are formed at a high temperature, the thermo stability thereof is high, so that the thermo stability of the CF film is improved.

It is also guessed that the reason why the variation in weight of the CF film in the case of (2) $N_2$ annealing for 2 hours is smaller than that in the case of (1) $N_2$ annealing for 1 hour is that the desorption of weak bonds and the recombination of uncombined hands proceed. Therefore, in an actual process, the annealing time may be determined in view of both of the stability and throughput of the CF film.

It is considered that the reason why the variation in weight of the CF film in the cases of (3) $H_2$ annealing and (4) $F_2$ annealing are smaller than that in the case of (1) $N_2$ annealing even if the annealing time is the same, 1 hour, is that weak C—F bonds in the CF film are desorbed similar to (1) $N_2$ annealing, and H and F in the atmospheres of (3) and (4) react with free atoms and molecules of F and CF existing in the CF film to be combined as follows, so that the desorption thereof proceeds.

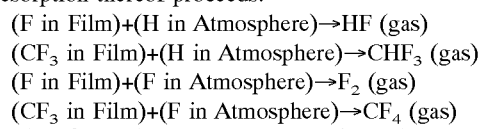

Therefore, when $H_2$ gas or $F_2$ gas is used as a process gas during annealing, it is possible to reduce the annealing time in comparison with the case where an inert gas, such as $N_2$ gas, is used.

Figure 7:
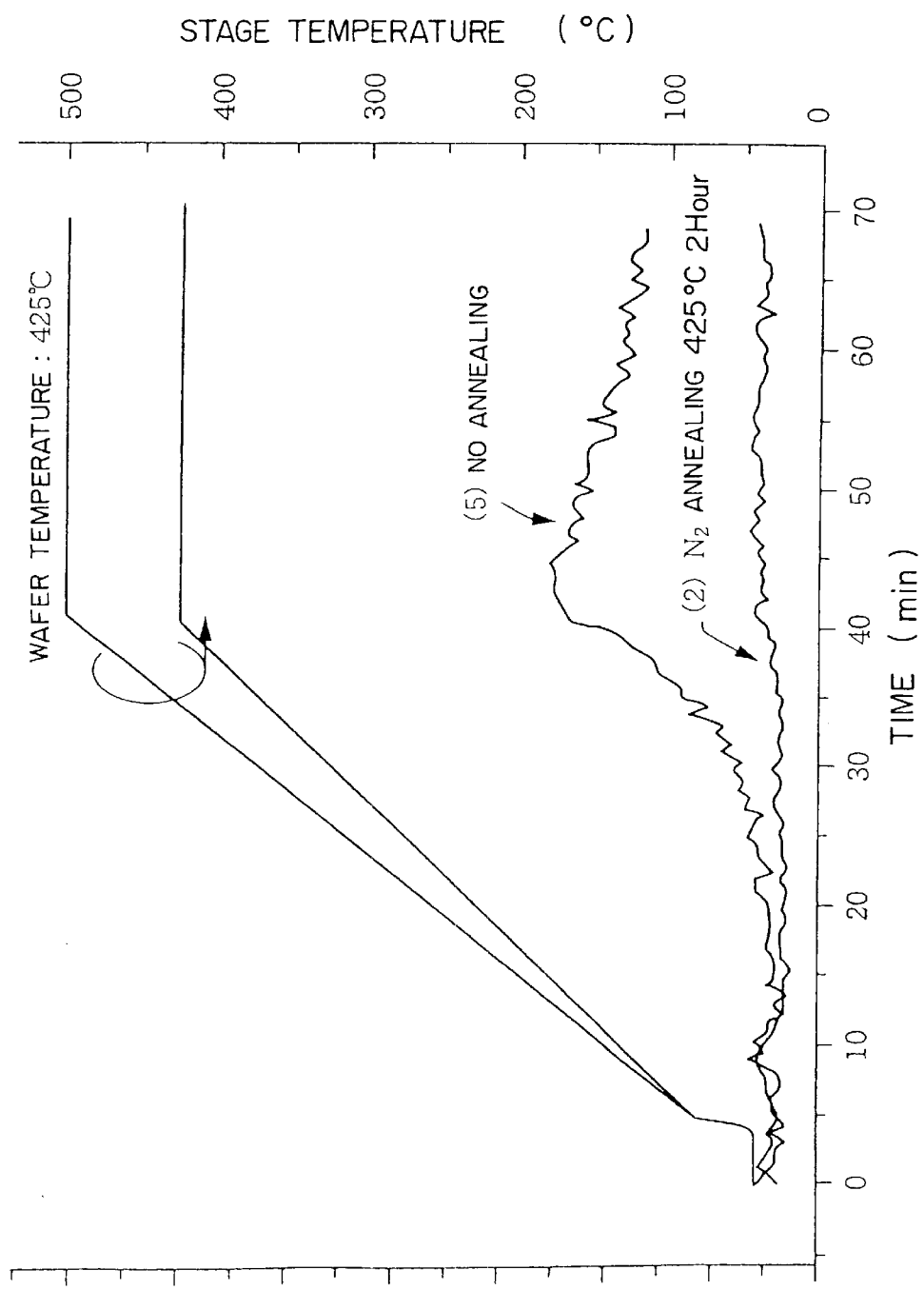
FIG. 7 is a characteristic diagram showing the results of the mass spectrometry of a CF film at a high temperature.
Figure 8:
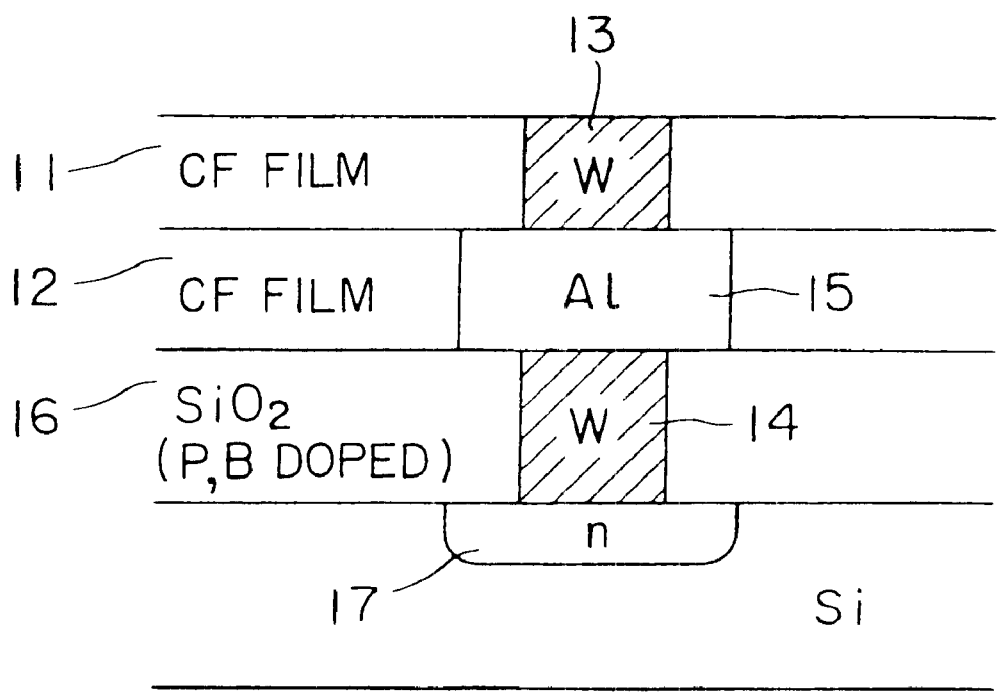
FIG. 8 is a structural drawing showing an example of a semiconductor device.

With respect to the samples (2) $N_2$ annealing for 2 hours and (5) no annealing, the mass spectrometry was carried out at a high temperature. Specifically, this measurement was carried out by a mass spectrometer connected to a vacuum vessel, in which a predetermined amount of thin-film was put and the interior of which was heated. The results thus obtained are shown in FIG. 7. In this drawing, the axis of ordinates denotes a dimensionless amount corresponding to the intensity of spectrum, and the peaks thereof denote the desorption of the respective gases. In addition, the axis of abscissas denotes elapsed time. Furthermore, this drawing also shows the variation in temperature of the wafer with respect to the elapsed time.

As can be clearly seen from FIG. 7, the number of free atoms desorbed from the CF film in the case of (2) according to the present invention is far smaller than that in the case of comparative example (5). It can also be seen from this result of the mass spectrometry that the annealed CF film has strong bonds and high stability. Furthermore, according to the present invention, gases for use in the heat treatment should not be limited to those in the aforementioned examples as long as the CF film obtained by the plasma treatment is heat treated to previously remove weak bonds to enhance thermo stability.

In place of the compound gases of C and F for used in the thin-film deposition process, gases containing C, F and H, e.g., $CHF_3$ gas, may be used. In addition, the gas used as the thin-film deposition gas with the CF gas should not be limited to $C_2H_4$ gas, but it may be a hydrocarbon gas, such as $CH_4$ gas or $C_2H_6$ gas, or it may be hydrogen gas in place of the hydrocarbon gas. Moreover, the present invention should not be limited to a method for producing plasma by the ECR, but the invention may be applied to a method for producing plasma by, e.g., a method called ICP (Inductive Coupled Plasma) for applying electric and magnetic fields to a process gas from a coil wound onto a dome-shaped container. While the thin-film deposition process has been carried out by the plasma CVD (Chemical Vapor Deposition) in the preferred embodiment, the present invention should not be limited thereto, but the thin-film deposition process may be carried out by the thermal CVD.

What is claimed is:

1. A method for producing an insulator film for use as an interlayer dielectric film in a semiconductor device having a multi-level interconnection structure, said method comprising:

decomposing a thin-film deposition gas containing a compound gas of carbon and fluorine to deposit an insulator film of a fluorine containing carbon film on a substrate; and heat treating said fluorine containing carbon film to desorb a part of components of said fluorine containing carbon film, wherein the heat treating comprises annealing said fluorine containing carbon film in an atmosphere of hydrogen gas.

2. A method for producing an insulator film for use as an interlayer dielectric film in a semiconductor device having a multi-level interconnection structure, said method comprising:

decomposing a thin-film deposition gas containing a compound gas of carbon and fluorine to deposit an insulator film of a fluorine containing carbon film on a substrate; and heat treating said fluorine containing carbon film to desorb a part of components of said fluorine containing carbon film, wherein the heat treating comprises annealing said fluorine containing carbon film in an atmosphere of fluorine gas.

3. The method of claim 1 or 2, wherein the decomposing comprises activating said thin-film deposition gas in order to deposit said insulator film of said fluorine containing carbon film on said substrate.

4. A method for producing an insulator film for use as an interlayer dielectric film in a semiconductor device having a multi-level interconnection structure, the method comprising:

introducing a plasma producing inert gas into a vacuum vessel;

introducing a thin-film deposition gas including a compound gas of carbon and fluorine into the vacuum vessel;

activating the plasma producing inert gas, wherein activating the plasma producing inert gas activates the thin-film deposition gas resulting in a thin fluorine containing carbon insulator film being deposited on a surface of a substrate; and heating the substrate in an atmosphere of one of hydrogen gas and fluorine gas in order to thermally stabilize the thin fluorine containing carbon insulator film.

5. The method of claim 4, wherein the inert gas is argon gas.

* * * * *